(12) United States Patent
Rozman et al.

(10) Patent No.: US 9,025,294 B2
(45) Date of Patent: May 5, 2015

(54) SYSTEM AND METHOD FOR CONTROLLING SOLID STATE CIRCUIT BREAKERS

(75) Inventors: Gregory I. Rozman, Rockford, IL (US);
Steven J. Moss, Rockford, IL (US);
Sastry V. Vedula, Loves Park, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 253 days.

(21) Appl. No.: 13/404,522

(22) Filed: Feb. 24, 2012

(65) Prior Publication Data
US 2013/0221941 A1 Aug. 29, 2013

(51) Int. Cl.
*H02H 3/08* (2006.01)
*G05F 1/10* (2006.01)
*H03K 17/082* (2006.01)
*H02H 9/00* (2006.01)
*H03K 17/16* (2006.01)

(52) U.S. Cl.
CPC ............. *H03K 17/0822* (2013.01); *H02H 3/08* (2013.01); *H02H 9/001* (2013.01); *H03K 17/163* (2013.01)

(58) Field of Classification Search
USPC ......................................... 361/93.9; 323/282
See application file for complete search history.

(56) References Cited

U.S. PATENT DOCUMENTS

| | | | | |
|---|---|---|---|---|
| 5,438,502 | A * | 8/1995 | Rozman et al. | 363/35 |
| 7,479,746 | B2 * | 1/2009 | Rozman et al. | 318/98 |
| 7,564,147 | B2 | 7/2009 | Michalko | |
| 8,390,121 | B2 * | 3/2013 | Okumura et al. | 257/745 |
| 8,395,873 | B2 * | 3/2013 | Rozman et al. | 361/101 |
| 2002/0015272 | A1 * | 2/2002 | Hattori | 361/93.1 |
| 2002/0070772 | A1 | 6/2002 | Neacsu et al. | |
| 2005/0275393 | A1 * | 12/2005 | Knoedgen et al. | 323/284 |
| 2008/0012622 | A1 * | 1/2008 | Khasiev et al. | 327/376 |
| 2008/0174184 | A1 * | 7/2008 | Arpilliere et al. | 307/125 |
| 2009/0315593 | A1 * | 12/2009 | Khasiev et al. | 327/108 |
| 2010/0208401 | A1 * | 8/2010 | Kimoto | 361/77 |
| 2011/0304942 | A1 | 12/2011 | Rozman et al. | |
| 2012/0007425 | A1 | 1/2012 | Rozman et al. | |
| 2012/0119711 | A1 * | 5/2012 | Rozman et al. | 322/22 |
| 2013/0033038 | A1 * | 2/2013 | Rozman et al. | 290/31 |
| 2013/0039105 | A1 * | 2/2013 | Rozman et al. | 363/126 |
| 2013/0187656 | A1 * | 7/2013 | Barrenscheen et al. | 324/415 |

FOREIGN PATENT DOCUMENTS

EP 0599455 A2 6/1994

OTHER PUBLICATIONS

The extended European Search Report of related European Application No. 13153330.9 filed Jan. 30, 2013.
Shen, Miaosen et al. "Simplified Loss Analysis for High Speed SiC MOSFET Inverter." Applied Power Electronics Conference and Exposition, 2012 IEEE, Feb. 5, 2012. pp. 1682-1687.
Kadavelugu, Arun et al. "Zero Voltage Switching Performance of 1200V SiC MOSFET, 1200V Silicon IGBT and 900V CoolMOS MOSFET." Energy Conversion Congress and Exposition, 2011 IEEE, Sep. 17, 2011. pp. 1819-1826.

* cited by examiner

*Primary Examiner* — Thienvu Tran
*Assistant Examiner* — Angela Brooks
(74) *Attorney, Agent, or Firm* — Kinney & Lange, P.A.

(57) ABSTRACT

A system for controlling a solid state circuit breaker comprises a solid state power switch, and a controller for providing a gate voltage to the power switch. During turnoff of the solid state power switch, the controller reduces the gate voltage to an intermediate level for a specified time period and then reduces the gate voltage to a turnoff level.

15 Claims, 5 Drawing Sheets

SYSTEM AND METHOD FOR CONTROLLING SOLID STATE CIRCUIT BREAKERS

BACKGROUND

The present invention is related to solid state circuit breakers, and in particular to a system and method for controlling turnoff of a solid state circuit breaker.

Circuit breakers are used in systems to prevent damage to a circuit in the event of a fault within the circuit. If a fault such as a short circuit occurs, an over-current condition is detected and the switch is automatically opened, cutting off power and preventing any damage to the circuit. In the past, this has been accomplished using electromechanical switches. These switches can experience problems with arcing during turnoff and bouncing during turn-on. Because of this, electromechanical circuit breakers can experience severe degradation over time. Further, electromechanical switches are often large and bulky, increasing the necessary size and weight of the circuit breaker.

In order to remedy the problems of electromechanical circuit breakers, solid state circuit breakers are often used. Solid state circuit breakers utilize solid state power switches which provide relatively fast response times compared to electromechanical switches, and are very small, which is ideal for systems such as those on an aircraft. These solid state switches also do not suffer from problems of arcing during turn-off transient, and bouncing during turn-on transient. However, solid state switches can encounter problems with electromagnetic interference (EMI) noise during switching and overvoltage stress on the solid state switching device during turnoff transient.

SUMMARY

A system and method for controlling a solid state circuit breaker includes a gate drive controller and a solid state power switch. During turnoff of the solid state power switch, the gate drive controller first steps down a gate voltage for the solid state power switch to an intermediate voltage level for a predetermined period of time, and then steps down the gate voltage to a turn-off voltage level.

DETAILED DESCRIPTION

The present invention describes a solid state circuit breaker system with controllable gate drive. In particular, the system includes a solid state power switch, a gate drive controller, a load, and a power source. The gate drive controller contains logic to control the voltage applied to the gate of the solid state power switch.

Figure 1:
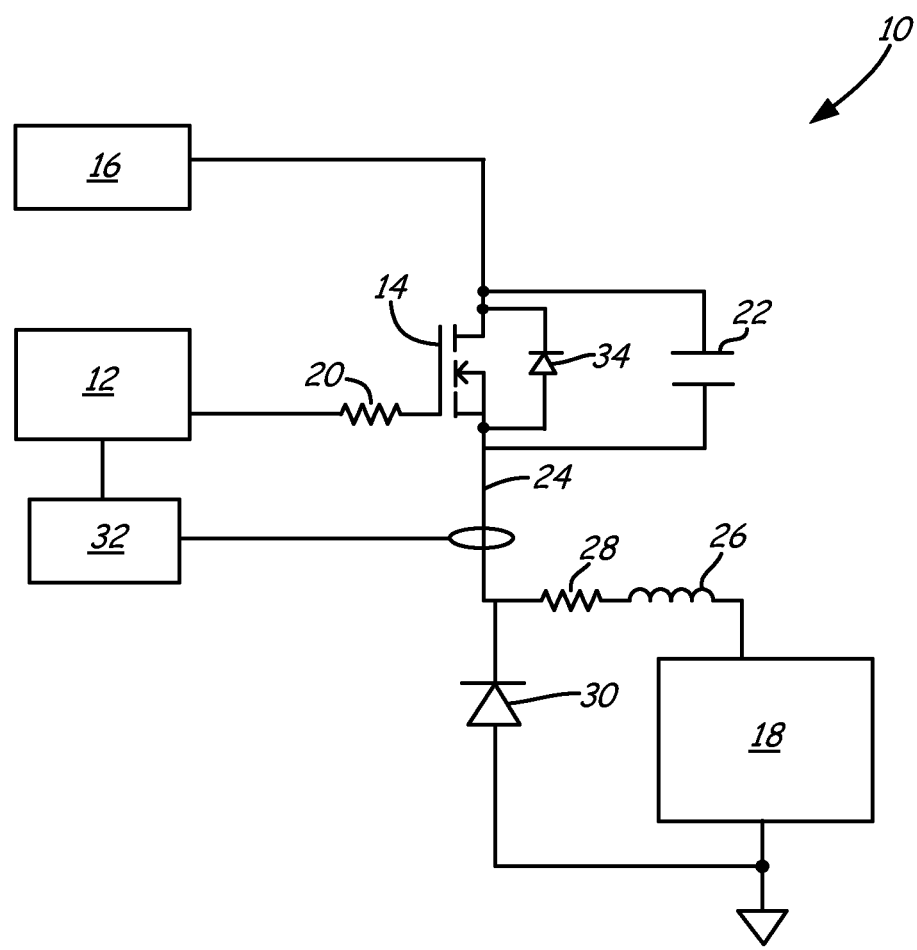
FIG. 1 is a circuit diagram illustrating a solid state circuit breaker control system according to an embodiment of the present invention.

FIG. 1 is a circuit diagram illustrating a solid state circuit breaker control system 10 according to an embodiment of the present invention. System 10 includes gate drive controller 12, solid state power switch 14, voltage source 16, load 18, gate resistance 20, output capacitance 22, current path 24, wire inductance 26, wire resistance 28, diode 30, monitor circuit 32, and body diode 34. Solid state power switch 14 may be any solid state switching device, such as silicon carbide metal-oxide-semiconductor field-effect transistor (SiC MOSFET). SiC MOSFETs are used in solid state circuit breakers because they provide fast switching times and very low drain to source on-resistances. Gate resistance 20 and output capacitance 22 represent the gate resistance and the output capacitance of solid state power switch 14, respectively. Wire inductance 26 and wire resistance 28 represent the inductance and resistance of current path 24, respectively. Diode 30 is implemented to provide overvoltage protection for load 18 during a turnoff event of power switch 14.

Solid state power switch 14 is controlled to selectively provide voltage from voltage source 16 to load 18. Voltage source 16 is implemented as a direct current (DC) voltage source in the present embodiment, but can also be implemented as an alternating current (AC) voltage source. Load 18 is connected to a second terminal of solid state power switch 14. Gate drive controller 12 is configured to provide a gate voltage to a gate terminal of solid state power switch 14 and may be implemented using a microcontroller, a field-programmable gate array (FPGA), or any other type of programmable logic device. When the gate voltage is above a turn-on voltage level, power is able to pass through solid state power switch 14 from voltage source 16 to load 18. When the gate voltage is below a turnoff level, power is cut off from power source 16 to load 18. On occasion, load 18 may experience an over-current fault situation such as a short circuit or an overload. Monitor circuit 32 is configured to detect these situations. Monitor circuit 32 may be any circuit known in the art capable of detecting over-current conditions, such as a current or voltage monitor. In the event of a detected over-current fault condition, among other reasons, gate drive controller 12 will reduce the gate voltage to solid state power switch 14 in order to turn off solid state power switch 14 and cut off power to load 18.

During traditional turnoff of solid state power switch 14, the voltage supplied to the gate terminal of power switch 14 is reduced from an 'on' voltage (e.g., 20 volts) to an 'off' voltage (e.g., −5 volts). During turn-off, power switch 14 may cause significant EMI due to its high frequency ringing. The ringing is caused by output capacitance 22 of power switch 14 resonating with stray inductance 26 in the high current path. System 10 addresses this ringing phenomenon by reducing the gate voltage to an intermediate level during turnoff of solid state power switch 14.

Figure 2:
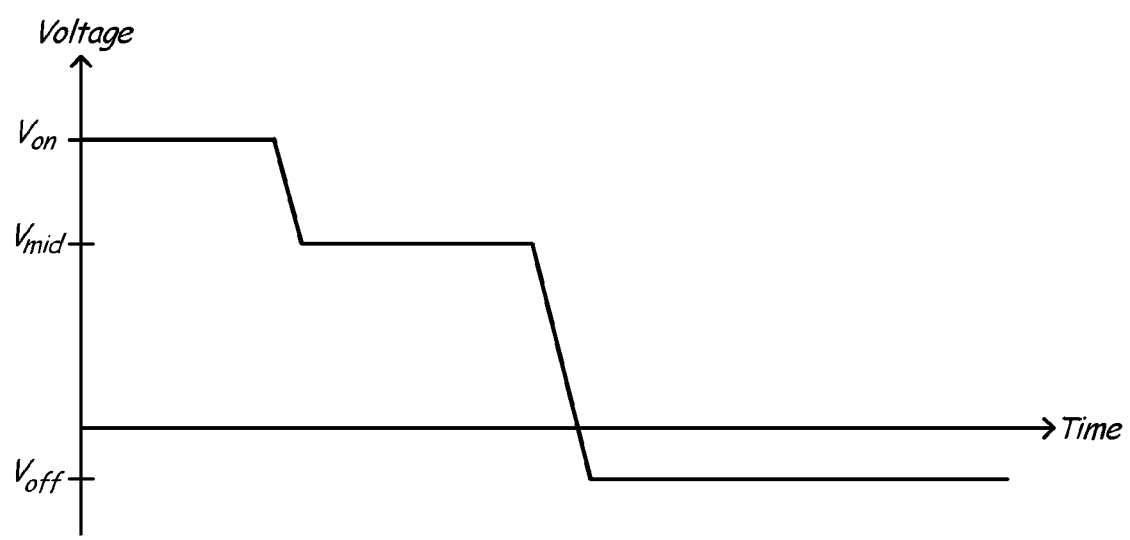
FIG. 2 is a chart illustrating a gate voltage during turnoff of a solid state switch according to an embodiment of the present invention.

FIG. 2 is a chart illustrating a gate voltage during turnoff transient of solid state power switch 14 according to an embodiment of the present invention. During normal operation of solid state power switch 14, the gate voltage is held at a high voltage ($V_{ON}$). This may be any voltage sufficient to turn on solid state power switch 14, such as 20 volts. When turning the switch off, the gate voltage is first reduced to an intermediate voltage ($V_{MID}$) for a period of time. In one embodiment, this time period may be between two and five microseconds and the intermediate voltage $V_{MID}$ is approximately 12 volts. By reducing the gate voltage to intermediate voltage $V_{MID}$, the device drain-to-source on-resistance of solid state power switch 14 is increased, which increases damping and reduces ringing in the circuit. The value of intermediate voltage $V_{MID}$ is selected to provide optimal damping for the circuit. The voltage is then reduced to a low voltage level ($V_{OFF}$), such as −5 volts, in order to turn solid state power switch 14 off.

Figure 3:
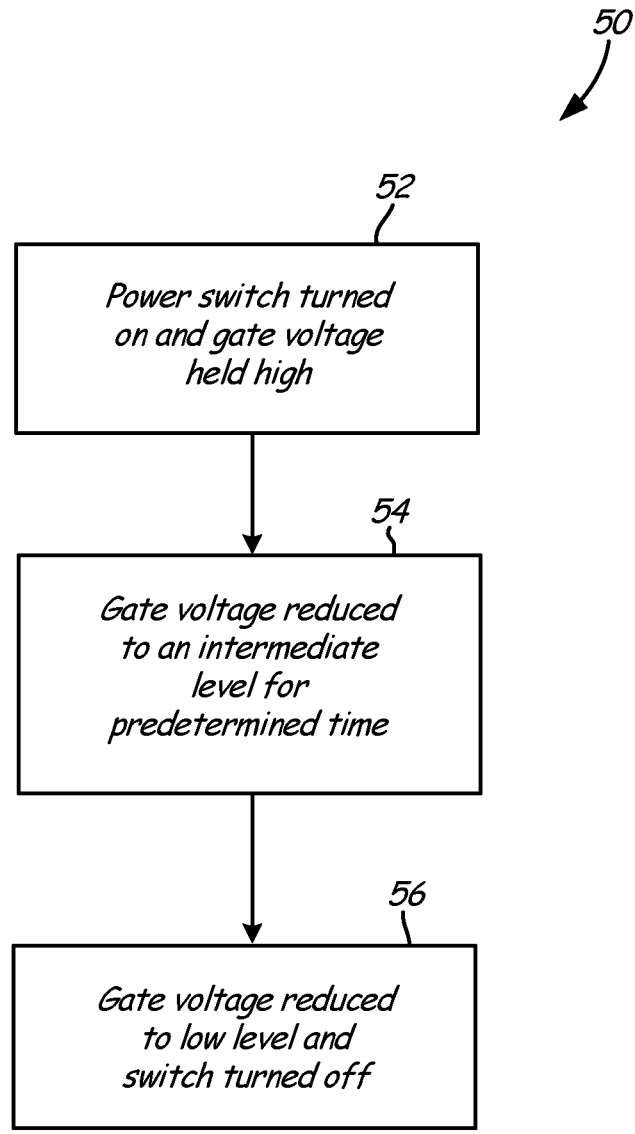
FIG. 3 is a flow chart illustrating a method of controlling a solid state circuit breaker using a programmable gate drive according to an embodiment of the present invention.

FIG. 3 is a flow chart illustrating a method 50 of controlling solid state power switch 14 using gate drive controller 12 according to an embodiment of the present invention. At step 52, solid state power switch 14 is conducting and the gate voltage is driven high by gate drive controller 12. At step 54, turnoff of solid state power switch 14 is initiated and the gate voltage is reduced to an intermediate level, $V_{MID}$ for a predetermined period of time such as two to five microseconds. At step 56, the gate voltage is reduced to a level, $V_{OFF}$, for which solid state power switch 14 is no longer conducting, such as −5 volts.

Reducing the gate voltage from intermediate voltage $V_{MID}$ directly to $V_{OFF}$ reduces ringing as compared to stepping down from $V_{ON}$ directly to $V_{OFF}$ due to the increased resistance between the source and drain terminals created when first reducing the gate voltage to intermediate voltage $V_{MID}$. In one embodiment, the ringing created when stepping down from intermediate voltage $V_{MID}$ to $V_{OFF}$ is further reduced by gradually ramping down the gate voltage when transitioning between $V_{MID}$ and $V_{OFF}$. By ramping down the voltage as opposed to directly stepping down the voltage the resistance between the source and drain terminals is gradually increased and the circuit is not excited.

Figure 4:
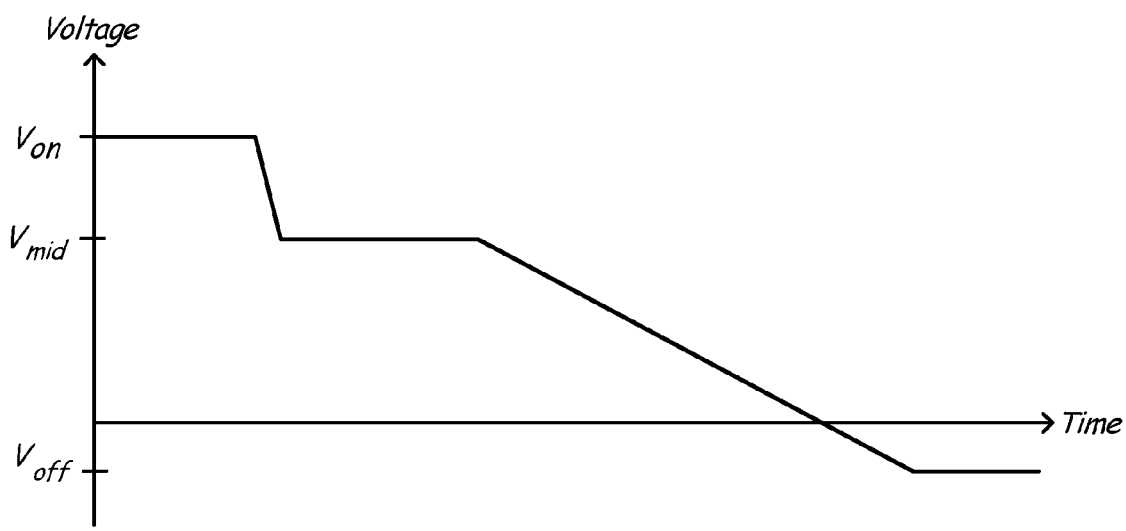
FIG. 4 is a chart illustrating a gate voltage during turn-off transient of a solid state switch according to an alternative embodiment of the present invention.

FIG. 4 is a chart illustrating a gate voltage during turnoff transient of solid state power switch 14 according to an embodiment of the present invention. During normal operation of solid state power switch 14, the gate voltage is held high at $V_{ON}$. This may be any voltage sufficient to turn on solid state power switch 14, such as 20 volts. When turning the switch off, the gate voltage is first stepped down to intermediate voltage $V_{MID}$ for a predefined period of time. In one embodiment, this time period is between two and five microseconds and the intermediate voltage $V_{MID}$ is approximately 12 volts. By first stepping down the voltage to $V_{MID}$, the device drain-to-source on-resistance of solid state power switch 14 is increased, which provides better damping of the circuit and reduces ringing in the circuit. The voltage is then gradually ramped down to a voltage $V_{OFF}$, such as −5 volts, in order to turn power switch 14 off. The voltage may be ramped down linearly (as shown in FIG. 4) or non-linearly. By gradually ramping down the voltage, as opposed to stepping down the voltage, the on-resistance between the source and drain terminals is gradually increased, and the circuit is not excited. Therefore, very little ringing occurs due to output capacitance 22 and stray inductance 26.

Figure 5:
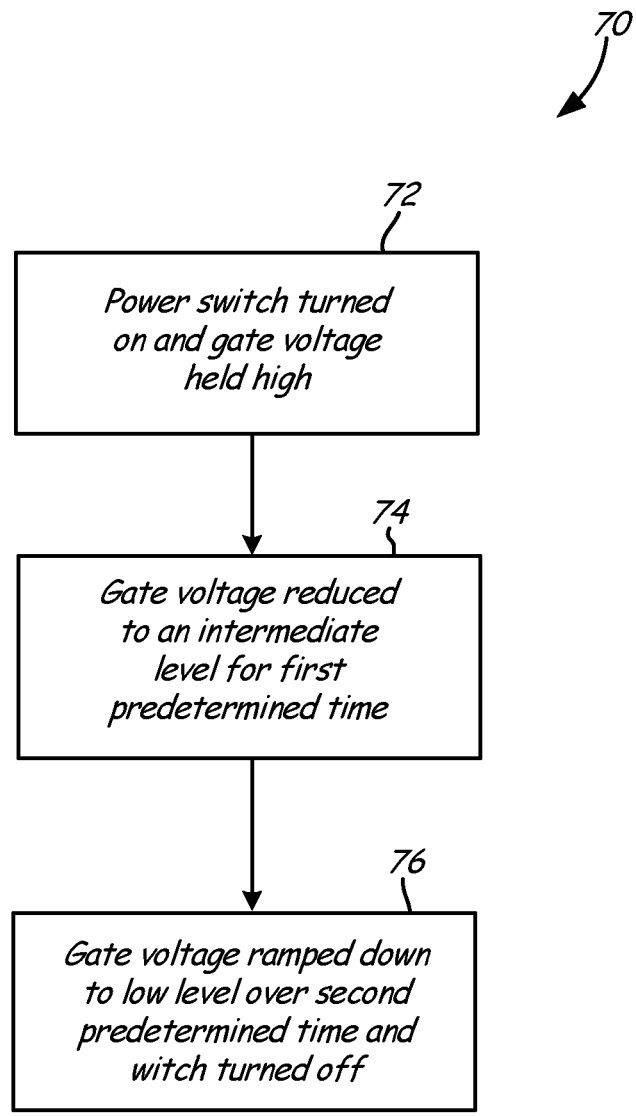
FIG. 5 is a flow chart illustrating an alternative method of controlling a solid state circuit breaker using a programmable gate drive according to an alternative embodiment of the present invention.

FIG. 5 is a flow chart illustrating a method 70 of controlling solid state power switch 14 using gate drive controller 12 according to an embodiment of the present invention. At step 72, switch 14 is on and the gate voltage is driven high by gate drive controller 12. At step 74, the gate voltage is stepped down to an intermediate level for a first predetermined period of time such as 2 to 5 microseconds. At step 76, the gate voltage is gradually reduced down to a level for which solid state power switch 14 is turned off, such as −5 volts, over a second predetermined period of time.

In this way, the present invention describes a solid state circuit breaker system that steps down the gate voltage on turn-off of the solid state power switch in order to prevent ringing. Although the present invention has been described with reference to preferred embodiments, workers skilled in the art will recognize that changes may be made in form and detail without departing from the spirit and scope of the invention.

The invention claimed is:

1. A solid state circuit breaker system comprising:
   a silicon carbide power switch having a first terminal, a second terminal and a gate terminal;
   a controller configured to output a control voltage to the gate terminal of the silicon carbide power switch to selectively turn the silicon carbide power switch ON and OFF; and
   wherein the controller turns the solid state power switch OFF by reducing the control voltage from an ON voltage level to an intermediate level for a first specified period of time and subsequently reducing the control voltage to an OFF voltage level, wherein the intermediate voltage is selected to provide damping for the solid state circuit breaker system.

2. The system of claim 1, wherein reducing the control voltage to a turnoff level comprises gradually reducing the control voltage over a second specified period of time.

3. The system of claim 1, wherein the first terminal is connected to a power source and the second terminal is connected to a load.

4. The system of claim 3, wherein turnoff of the silicon carbide power switch occurs in response to a detected over-current condition in the load.

5. The system of claim 1, wherein the ON voltage level is approximately 20 volts, the intermediate voltage level is approximately 12 volts, the OFF voltage level is approximately −5 volts, and the first specified period of time is approximately two to five microseconds.

6. A method for turning OFF a solid state circuit breaker, that includes a silicon carbide power switch having a first terminal, a second terminal, and a gate terminal, the method comprising:
   reducing, using a controller, a control output voltage provided by the controller to the gate terminal from an ON voltage level to an intermediate voltage level for a predefined amount of time, wherein the intermediate voltage level is selected to provide damping for the solid state circuit breaker; and
   reducing the control output voltage provided by the controller to the gate terminal from the intermediate voltage level to an OFF voltage level.

7. The method of claim 6, wherein the predefined amount of time is between two microseconds and five microseconds.

8. The method of claim 6, wherein the ON voltage level is approximately 20 volts, the intermediate voltage level is approximately 12 volts, and the OFF voltage level is approximately −5 volts.

9. The method of claim 6, wherein reducing the control output voltage provided by the controller to the gate terminal from an ON voltage level to an intermediate voltage level occurs in response to detecting an over-current condition in a load.

10. A method for turning OFF a solid state circuit breaker, that includes a silicon carbide power switch having a first terminal, a second terminal, and a gate terminal, the method comprising:
    reducing, using a controller, a control output voltage provided by the controller to the gate terminal from an ON voltage level to an intermediate voltage level for a predefined amount of time, wherein the intermediate voltage is selected to provide damping for the solid state circuit breaker; and gradually reducing, using the controller, the control output voltage provided by the controller to the gate terminal from the intermediate voltage level to an OFF voltage level.

11. The method of claim 10, wherein the ON voltage level is approximately 20 volts, the intermediate voltage level is approximately 12 volts, and the OFF voltage level is approximately −5 volts.

12. The method of claim 10, wherein the first predefined amount of time is approximately two to five microseconds.

13. The method of claim 10, wherein gradually reducing the control output voltage provided by the controller to the gate terminal is performed linearly.

14. The method of claim 10, wherein gradually reducing the control output voltage provided by the controller to the gate terminal is performed non-linearly.

15. The method of claim 10, wherein stepping down to an intermediate voltage occurs in response to detecting an overcurrent condition in the load.

\* \* \* \* \*